United States Patent [19]

Kiryu et al.

[11] Patent Number: 4,833,342

[45] Date of Patent: May 23, 1989

[54] REFERENCE POTENTIAL GENERATING CIRCUIT

[75] Inventors: Masakazu Kiryu, Yokosuka; Hiroyuki Koinuma; Kiminobu Suzuki, both of Yokohama, all of Japan

[73] Assignee: Kabushiki Kaisha Toshiba, Kawasaki, Japan

[21] Appl. No.: 192,667

[22] Filed: May 10, 1988

[30] Foreign Application Priority Data

May 15, 1987 [JP] Japan ................................ 62-117113

[51] Int. Cl.[4] .................... H03K 17/14; H03K 17/687; H03K 5/01; H03K 3/86

[52] U.S. Cl. ................................ 307/296.1; 307/605; 307/304; 307/559; 307/544; 307/296.8; 323/313; 323/314

[58] Field of Search ............... 307/590, 601, 603, 605, 307/606, 450, 451, 270, 279, 290, 576, 579, 574, 581, 296 R, 296 A, 297, 530, 304, 296.1, 544, 296.6, 559, 296.8; 323/313, 314

[56] References Cited

U.S. PATENT DOCUMENTS

| | | | |
|---|---|---|---|
| 3,956,661 | 5/1976 | Sakamoto et al. | 307/297 |
| 4,100,437 | 7/1978 | Hoff, Jr. | 307/297 |
| 4,224,539 | 9/1980 | Musa et al. | 307/297 X |
| 4,318,040 | 3/1982 | Hilbourne | 323/312 |
| 4,375,596 | 3/1983 | Hoshi | 307/297 |
| 4,446,383 | 5/1984 | Concannon et al. | 307/297 |
| 4,614,882 | 9/1986 | Parker et al. | 307/297 X |
| 4,636,664 | 1/1987 | Craycraft et al. | 307/530 |
| 4,641,081 | 2/1987 | Sato et al. | 323/314 X |
| 4,649,291 | 3/1987 | Konishi | 307/304 X |
| 4,663,584 | 5/1987 | Okada et al. | 307/296 R X |
| 4,686,451 | 8/1987 | Li et al. | 307/297 X |
| 4,709,168 | 11/1987 | Kamuro et al. | 307/574 X |

FOREIGN PATENT DOCUMENTS

| | | | |
|---|---|---|---|
| 0029231 | 5/1981 | European Pat. Off. . | |
| 54-34044 | 3/1979 | Japan | 307/296 R |

OTHER PUBLICATIONS

Grunberg et al., "A Bias Circuit Compensated for Threshold and Supply Variations", IBM Technical Disclosure Bulletin, vol. 16, No. 1, pp. 25–26, Jun. 1973.

*Primary Examiner*—Stanley D. Miller
*Assistant Examiner*—David R. Bertelson
*Attorney, Agent, or Firm*—Finnegan, Henderson, Farabow, Garrett, & Dunner

[57] ABSTRACT

A reference potential generating circuit according to this invention includes a first insulated gate field effect transistor of an enhancement type, a second insulated gate field effect transistor of a depletion type and a voltage dividing circuit. The source of the first insulated gate field effect transistor is connected to the ground terminal, and the drain and gate thereof are connected to one another. The drain of the second insulated gate field effect transistor is connected to the power source and the gate thereof is connected to a connection node which connects the drain and gate of the first insulated gate field effect transistor. The voltage dividing circuit is connected between the drain of the first insulated gate field effect transistor and the source of the second insulated gate field effect transistor.

10 Claims, 6 Drawing Sheets

REFERENCE POTENTIAL GENERATING CIRCUIT

BACKGROUND OF THE INVENTION

1. Field of the Invention

This invention relates to a reference potential generating circuit for generating a reference potential used for, for example, a sense amplifier in a semimemory device.

2. Description of the Related Art

In general, a power source voltage dependent type or threshold voltage dependent type circuit is widely used as a reference potential generating circuit. The power source voltage dependent type reference potential generating circuit includes a plurality of load elements connected in series between the power source terminal and the ground terminal. The reference potential is derived from a connection node between the load elements. Resistors or depletion type insulated gate field effect transistors are used as the load elements. The reference potential is derived by dividing the voltage between the power source terminal and the ground terminal by using the load elements as voltage dividing resistors. In this case, however, the reference potential derived from the circuit is largely dependent on the power source voltage. Thus, if the reference potential is dependent on the power source voltage and when the power source voltage varies, the reference potential fluctuates. Therefore, if the power source voltage dependent type reference potential generating circuit is used in a sense amplifier circuit, an error operation, for example, erroneous readout of memory data occurs when the power source voltage varies. The power source voltage may be varied by, for example, power source voltage noise.

In contrast, a reference potential from the threshold voltage dependent type reference potential generating circuit is less dependent on the power source voltage. The threshold voltage dependent type reference potential generating circuit functions to generate a reference potential by utilizing a threshold voltage of an insulated gate field effect transistor. That is, the reference potential generating circuit is constituted by connecting a depletion type insulated gate field effect transistor whose gate is grounded between the power source terminal and the series-connected load elements. The reference potential from the reference potential generating circuit is largely dependent on the threshold voltage of the transistor. Thus, the reference potential generated from the threshold voltage dependent type reference potential generating circuit will not greatly fluctuate even if the power source voltage varies, but tends to fluctuate according to variation in the threshold voltage of the transistor. Therefore, if the threshold voltage dependent type reference potential generating circuit is used in the sense amplifier circuit and when the threshold voltage of the transistor is changed, then erroneous operation such as erroneous readout of memory data will occur. The threshold voltage of the transistor may be changed by variation in the transistor characteristics caused in the manufacturing process, for example.

As described above, the output potential of the power source voltage dependent type reference potential generating circuit is little affected by the threshold voltage of the transistor but largely depends on the power source voltage, and the output potential of the threshold voltage dependent type reference potential generating circuit is little affected by the power source voltage but largely depends on the threshold voltage of the transistor. Therefore, the output potential of the conventional reference potential generating circuit will fluctuate according to the power source voltage noise or variation in the transistor characteristics caused in the manufacturing process.

In semiconductor memory devices, for example, if the power sourceb voltage or signals externally supplied are little dependent on the power source voltage and the threshold voltage of the transistor or the like, it is necessary to make the reference potential generated from the reference potential generating circuit little dependent on both the power source voltage and the threshold voltage of the transistor. That is, the conventional reference potential generating circuit does not fully satisfy the requirement for preventing fluctuation of the reference potential when used in the sense amplifier circuit of the semiconductor memory device.

SUMMARY OF THE INVENTION

An object of this invention is to provide a reference potential generating circuit which is less dependent on both the power source voltage and the threshold voltage of the transistor.

The object can be attained by a reference potential generating circuit comprising a first insulated gate field effect transistor of enhancement type whose source is grounded and whose drain and gate are connected together; a second insulated gate field effect transistor of depletion type whose drain is connected to a power source and whose gate is connected to a connection node between the drain and gate of the first insulated gate field effect transistor; and a voltage dividing circuit connected between the drain of the first insulated gate field effect transistor and the source of the second gate field effect transistor.

With this construction, the influence of variation in the threshold voltage of the second insulated gate field effect transistor on the output potential can be suppressed by means of the first insulated gate field effect transistor. This is because the characteristics of variation in the threshold votages of the first and second insulated gate field effect transistors are different from each other and the variations in the threshold voltages can be cancelled with each other. Further, the reference potential generating circuit is basically a threshold voltage dependent type and is dependent on the threshold voltage of the second inulated gate field effect transistor so that it is less dependent on the power source voltage. Therefore, the reference potential generating circuit can be less dependent on both the power source voltage and the threshold voltage of the transistor.

DETAILED DESCRIPTION OF THE PREFERRED EMBODIMENTS

Figure 1:
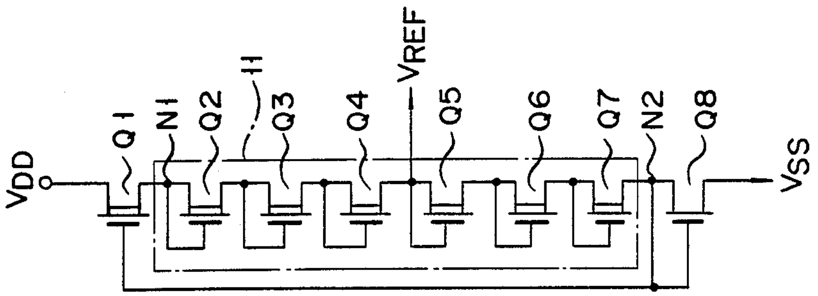
FIG. 1 is a circuit diagram of a reference potential generating circuit according to a first embodiment of this invention.

FIG. 1 shows a reference potential generating circuit according to a first embodiment of this invention. The drain-source paths or current paths of depletion type insulated gate field effect transistors Q1 to Q7 and the drain-source path or current path of enhancement type insulated gate field effect transistor Q8 are serially connected between power source terminal $V_{DD}$ and ground terminal $V_{SS}$. The gate of transistor Q1 is connected to the gate and drain of transistor Q8. Further, th gate and drain of each of transistors Q2 and Q7 are connected to one another. Thus, transistors Q2 and Q7 consitute voltage dividing circuit 11 for dividing a voltage between the source of transistor Q1 and the drain of transistor Q8. Reference voltage $V_{REF}$ is derived from a connection node positioned between transistors Q4 and Q5.

There will now be described an operation of the circuit with the construction described above. When power source voltage $V_{DD}$ is applied, depletion type insulated gate field effect transistors Q1 to Q7 are gradually rendered conductive. As a result, the potential at a connection node or node N2 located between transistors Q7 and Q8 rises from ground potential $V_{SS}$ and is set stably at a level which is higher than the ground potential by the threshold voltage of enhancement type insulated gate field effect transistor Q8. Then, after power source voltage $V_{DD}$ has risen to a sufficiently high level, transistor Q is operated in a pentode operation mode. At this time, the potential at a connection node or node N1 between transistors Q1 and Q2 is set, by the threshold voltage of transistor Q1, at a level lower than the gate voltage of transistor Q1 or the potential at node N1. Reference potential $V_{REF}$ can be obtained by dividing a voltage between nodes N1 and N2 according to the ratio of the sum of conductive resistances of transistors Q2 to Q4 to the sum of conduction resistances of transistors Q5 ot Q7.

With this construction, reference potential $V_{REF}$ depends on the threshold voltage of transistor Q1 and is therefore less dependent on power sorce voltage $V_{DD}$. Depletion type insulated gate field effect transistor Q1 and enhancement type insulated gate field effect transistor Q8differ from one another in the variation mode of the threshold voltage. The voltage dividing ratio of voltage dividing circuit 11 is determined by the difference between the degrees of variation in the threshold voltages of transistors Q1 and Q8. Therefore, the influence of the threshold voltage of transistor Q1 which causes variation in the reference potential $V_{REF}$ can be suppressed. The voltage dividing ratio can be determined by, for example, changing the number of the series-connected transistors (Q2 to Q7) or deriving reference potential $V_{REF}$ from a different connection node.

Figure 2:
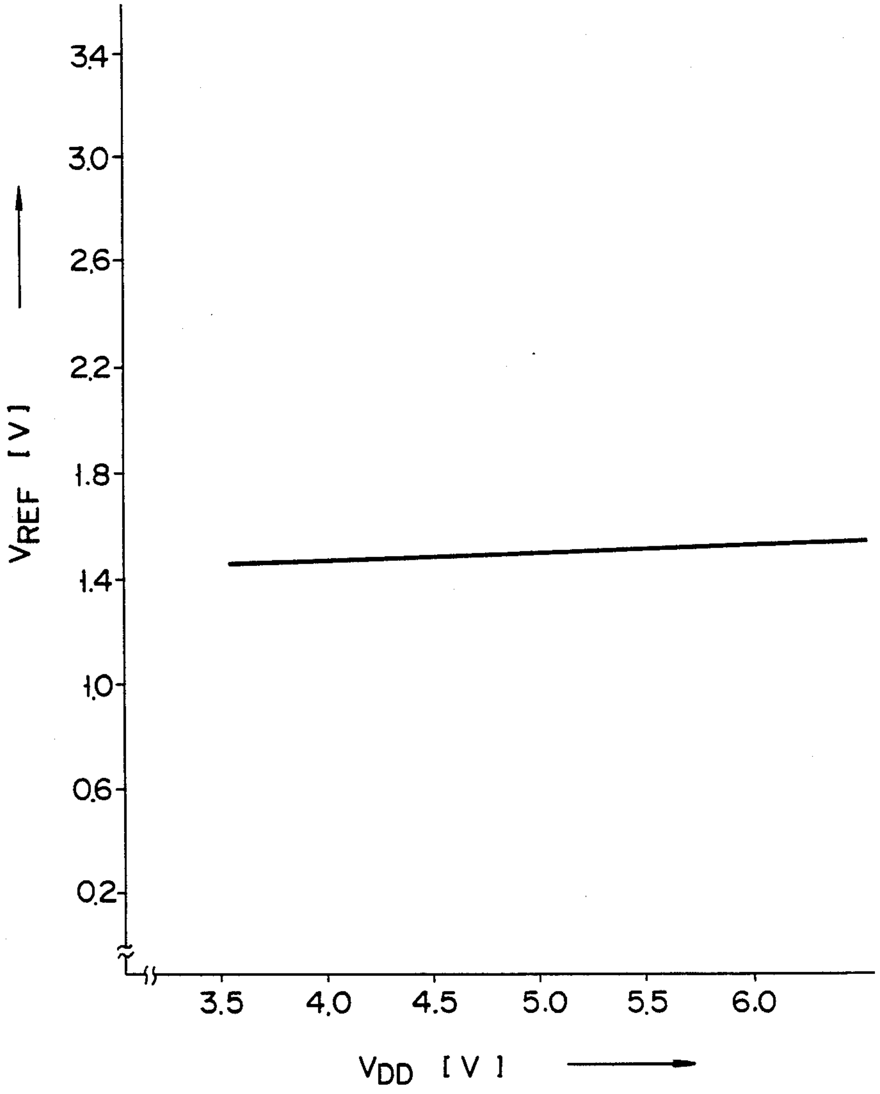
FIG. 2 is a diagram for explaining the dependency of a reference potential from the reference potential generating circuit of FIG. 1 on the power source voltage.
Figure 3:
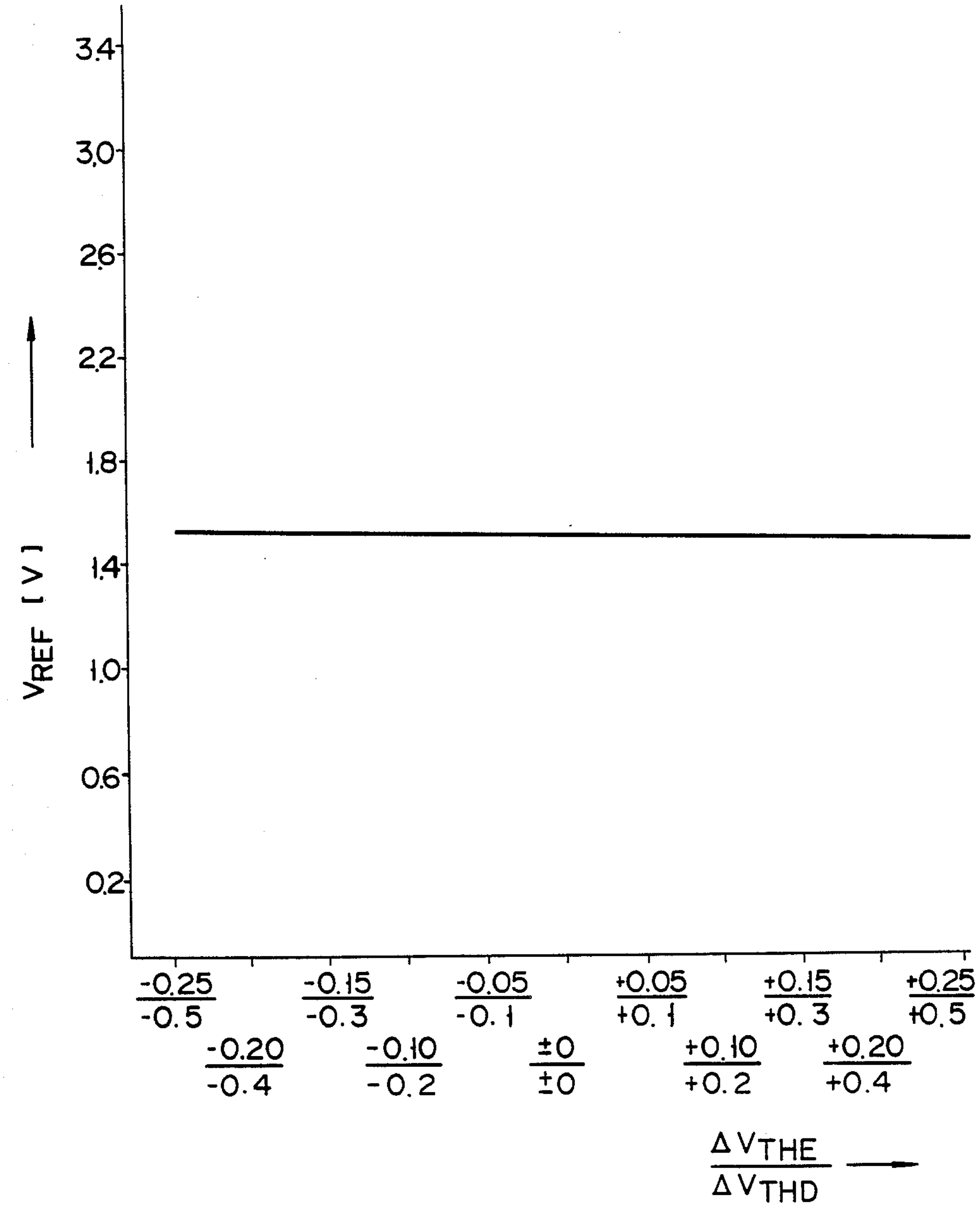
FIG. 3 is a diagram for explaining the dependency of a reference potential from the reference potential generating circuit of FIG. 1 on the threshold voltage.

FIG. 2 shows the dependency of the reference voltage generating circuit shown in FIG. 1 on the power source voltage. FIG. 3 shows the dependency of the circuit of FIG. 1 on the threshold voltage in the case where variation $\Delta V_{THD}$ in the threshold voltage of the depletion type insulated gate field effect transistor is twice variation $\Delta V_{THE}$ in the threshold voltage of the enhancement type insulated gate field effect transistor.

The dependence of the reference potential generating circuit of FIG. 1 on the power source voltage is as low as in the conventional threshold voltage dependent type reference potential generating circuit, and the dependence on the threshold voltage is as low as in the conventional power source voltage dependent type reference voltage generating cirucit. The reference voltage generating circuit thus provided is less dependent on both the power source voltage and the threshold voltage.

Figure 4:
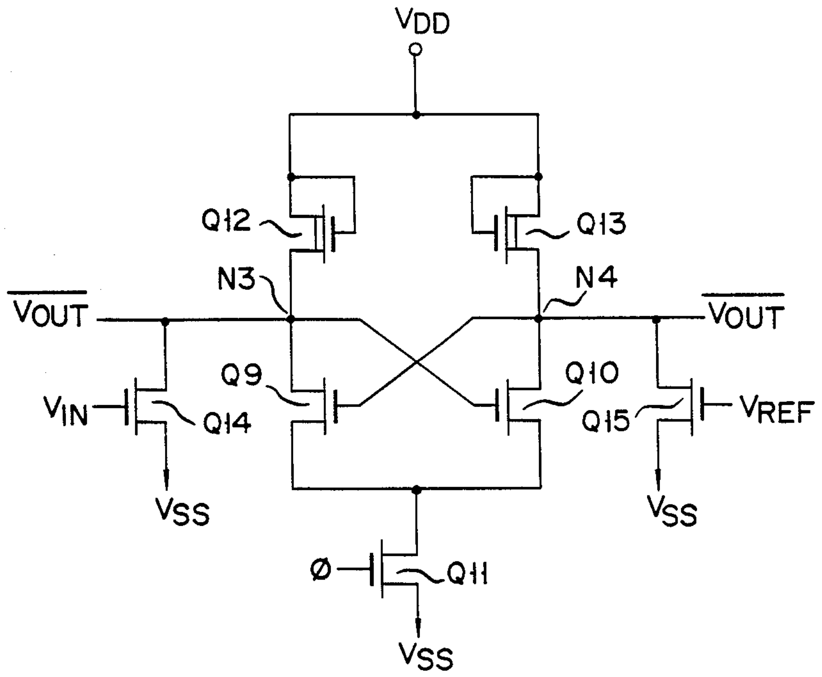
FIG. 4 is a circuit diagram of an example of a circuit to be supplied with an output potential from the reference potential of FIG. 1.

The reference potential generating circuit of FIG. 1 is used to generate reference potential $V_{REF}$ for a sense amplifier of FIG. 4, for example. Enhancement type insulated gate field effect transistors Q9 and Q10 of the sense amplifier constitute a differential input pair. Transistors Q9 and Q10 are connected to one another at one terminal and the gates thereof are crosscoupled to the other terminals of the respective transistors. The current path between the drain and source of enhancement type insulated gate field effect transistor Q11 is connected between a connection node between transistors Q9 and Q10 and ground terminal $V_{SS}$. The conduction state of transistor Q11 is controlled by signal $\phi$ for driving the sense amplifier and thus transistor Q11 functions as a current source. The current path between the drain and source of depletion type insulated gate field effect transistor Q12 is connected between the other terminal of transistor Q9 and power source terminal $V_{DD}$, and the gate of transistor Q12 is connected to power source terminal $V_{DD}$. The current path between the drain and source of depletion type insulated gate field effect transistor Q13 is connected between the other terminal of transistor Q10 and power source terminal $V_{DD}$, and the gate of transistor Q13 is connected to power source terminal $V_{DD}$. The drain and source of enhancement type insulated gate field effect transistor Q14 are respectively connected to a connection node (node N3) between transistors Q9 and Q12 and ground terminal $V_{SS}$. The conduction state of transistor Q14 is controlled by externally-supplied input signal $V_{IN}$. The drain and source of enhancement type insulated gate field effect transistor Q15 are respectively connected to a connection node (node N4) between transistors Q10 and Q13 and ground terminal $V_{SS}$. The conduction state of transistor Q15 is controlled by output voltage $V_{REF}$ from the reference potential generating circuit of FIG. 1. Memory cells and dummy cell which are not shown are respectively connected to node N3 and N4. Output signal $\overline{V_{OUT}}$ is derived from node N3, and output signal $V_{OUT}$ is derived from node N4.

In the circuit with the construction described above, externally supplied input signal $V_{IN}$ is determined to be at either a high ("H") level or a low ("L") level based on the following determination conditions (a) and (b).

(a) The sense amplifier determines externally supplied input signal $V_{IN}$ to be of an "H" level signal when input signal $V_{IN}$ is higher than 2.4 V.

(b) The sense amplifier determines externally supplied input signal $V_{IN}$ to bge an "L" level signal when input signal $V_{IN}$ is lower than 0.8 V.

In order to check whether or not the input signal meets the above condition, it is necessary to set a criterion or reference potential with respect to the "H" and "L" potential levels. When reference potential $V_{REF}$ used for the level determination is so set to have margins in "H" and "L" level directions, it will be set at 1.6 V which is an intermediate potential between the lower limit potential 2.4 V of the "H" level and the upper limit potential 0.8 V of "L" level. Thus, reference potential $V_{REF}$ of 1.6 V is supplied from the reference potential generating circuit of FIG. 1 to the gate of transistor Q15.

Figure 5:
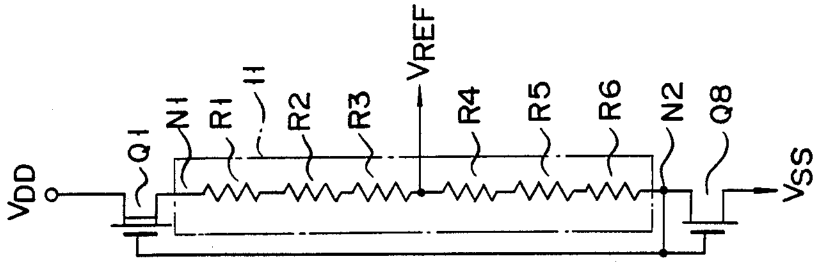

This invention has been described with reference to the embodiment, but this invention is not limited to the above embodiment and can be variously modified. For example, in the above embodiment, transistors Q2 to Q7 each having the drain and gate connected together are used as voltage dividing circuit 11 connected between nodes N1 and N2. However, it is possible to connect a plurality of resistors R1 to R6 in series between nodes N1 and N2 as shown in FIG. 5, and selectively derive reference potential $V_{REF}$ from a connection node between two of resistors R1 to R6.

Figure 6:
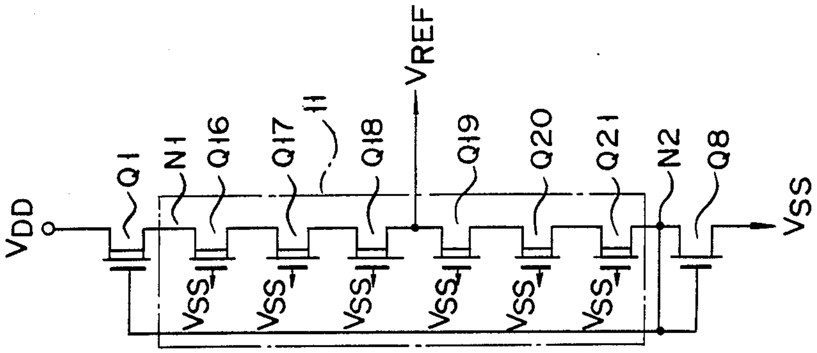
FIGS. 5 to 10 are circuit diagrams showing reference potential generating circuits according to second to seventh embodiments of this invention.
Figure 7:
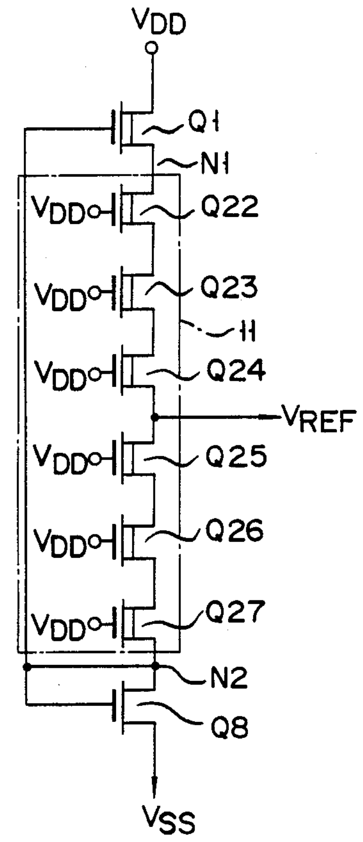

Further, it is possible to connect depletiion type insulated gate field effect transistors Q16 to Q21 whose gates are connected to ground terminal $V_{SS}$ between nodes N1 and N2 as shown in FIG. 6. It is also possible to connect depletion type insulated gate field effect transistors Q22 to Q27 whose gates are connected to power source terminal $V_{DD}$ between nodes N1 and N2 as shown in FIG. 7. In either case, the same operability and effects as those of the former embodiment can be attained.

Figure 8:
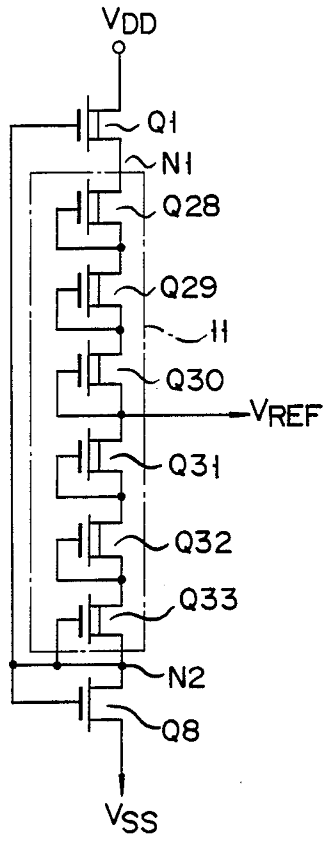

In the embodiment of FIG. 1, transistors Q2 to Q7 whose gate and drain are connected to one another are used, but it is possible to use depletiion type insulated gate field effect transistors Q28 to Q33 whose source and gate are connected to one another as shown in FIG. 8.

Figure 9:
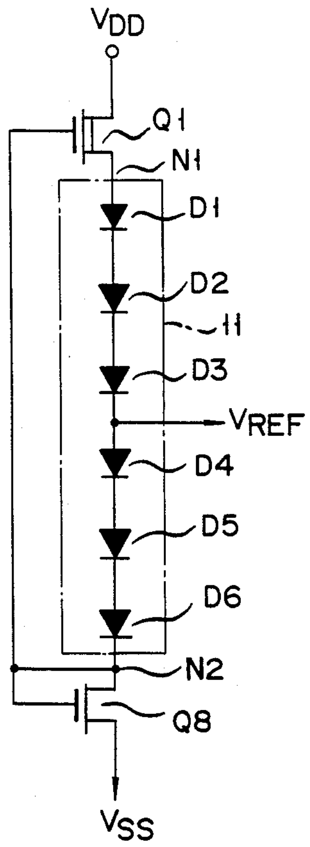

FIG. 9 shows another embodiment of this invention. As shown in FIG. 9, voltage dividing circuit 11 is constituted by series-connected diodes D1 to D6. With this construction, basically the same operability and effects as those of the former embodiment can be obtained.

Figure 10:
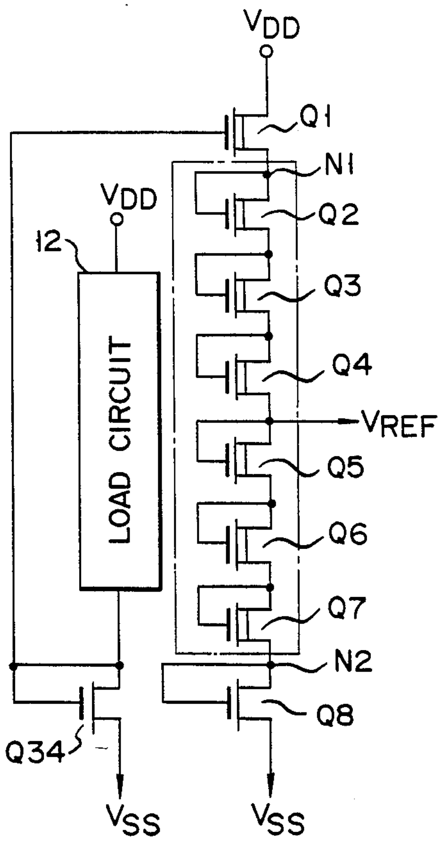

FIG. 10 shows still another embodiment of this invention. The circuit can be obtained by adding load circuit 12 and enhancement type insulated gate field effect transistor Q34 to the circuit of FIG. 1. The gate and drain of transistor Q34 are connected to the gate of transistor Q1 and the source thereof is connected to ground terminal $V_{SS}$. Load circuit 12 is connected between power source terminal $V_{DD}$ and the drawing of transistor Q34.

In the circuits of FIGS. 1, and 5 to 9, the gate potential of transistor Q1 is determined by the threshold voltage of transistor Q8. In contrast, in the circuit of FIG. 10, the gate potential of transistor Q1 is determined by means of load circuit 12 and transistor Q34. That is, the gate potential of transistor Q1 can be freely determined by use of load circuit 12 and transistor Q34. As a result, it becomes possible to precisely and freely compensate for the dependence of output voltage $V_{REF}$ on the threshold voltage.

As described above, according to this invention, a reference potential generating circuit can be provided which is less dependent on both the power source voltage and the threshold voltage of the transistor used.

What is claimed is:

1. A reference potential generating circuit comprising:

a first potential supplying source;

a second potential supplying source;

a first insulated gate field effect transistor of an enhancement type having a source connected to said first potential supplying source, and a drain and a gate which are connected to one another;

a second insulated gate field effect transistor of a depletion type having a drain connected to said second potential supplying source and a gate connected to a connection node positioned between the drain and gate of said first insulated gate field effect transistor; and voltage dividing means connected between the drain of said first insulated gate field effect transistor and the source of said second insulated gate field effect transistor.

2. A reference potential generating circuit according to claim 1, wherein said first potential supplying source is a ground terminal and said second potential supplying source is a power source.

3. A reference potential generating circuit according to claim 1, wherein said voltage dividing means includes a plurality of depletion type insulated gate field effect transistors which are serially connected between the drain of said first insulated gate field effect transistor and the source of said second insulated gate field effect transistor and each of which has a drain and a gate which are connected to one another, and an output voltage is derived from a connection node positioned between two of said depletion type insulated gate field effect transistors.

4. A reference potential generating circuit according to claim 1, wherein said voltage dividing means includes a plurality of resistors which are serially connected between the drain of said first insulated gate field effect transistor and the source of said second insulated gate field effect transistor, and an output voltage is derived from a connection node positioned between two of said resistors.

5. A reference potential generating circuit according to claim 1, wherein said voltage dividing means includes a plurality of depletion type insulated gate field effect transistors which are serially connected between the drain of said first insulated gate field effect transistor and the source of said second insulated gate field effect transistor and each of which has a gate connected to the ground terminal so as to be set in a conductive state, and an output voltage is derived from a connection node positioned between two of said depletion type insulated gate field effect transistors.

6. A reference potential generating circuit according to claim 1, wherein said voltage dividing means includes a plurality of depletion type insulated gate field effect transistors which are serially connected between the drain of said first insulated gate field effect transistor and the source of said second insulated gate field effect transistor and each of which has a gate connected to a power source so as to be set in a conductive state, and an output voltage is derived from a connection node positioned between two of said depletion type insulated gate field effect transistors.

7. A reference potential generating circuit according to claim 1, wherein said voltage dividing means includes a plurality of depletion type insulated gate field effect transistors which are serially connected between the drain of said first insulated gate field effect transistor and the source of said second insulated gate field effect transistor and each of which has a source and a gate which are connect to one another, and an outpiut voltage is derived from a connection node located between adjacent two of said depletion type insulated gate field effect transistors.

8. A reference potential generating circuit according to claim 1, wherein said voltage dividing means includes a plurality of diodes which are serially connected between the drain of said first insulated gate field effect transistor and the source of said second insulated gate field effect transistor, and an output voltage is derived from a connection node located between adjacent two of said diodes.

9. A reference potential generating circuit according to claim 1, said reference potential generating circuit being constituted to generate a reference voltage for a sense amplifier.

10. A reference potential generating circuit according to claim 1, further comprising an enhancement type insulated gate field effect transistor having a drain-source path connected between the gate of said second insulated gate field effect transistor and said first potential supplying source, and load means connected at one end to the drain and gate of said enhancement type insulated gate field effect transistor and at the other end to said second potential supplying source.

* * * * *